(12) United States Patent
Cho et al.

(10) Patent No.: US 11,694,968 B2
(45) Date of Patent: Jul. 4, 2023

(54) THREE DIMENSIONAL INTEGRATED SEMICONDUCTOR ARCHITECTURE HAVING ALIGNMENT MARKS PROVIDED IN A CARRIER SUBSTRATE

(71) Applicant: SAMSUNG ELECTRONICS CO., LTD., Suwon-si (KR)

(72) Inventors: Seok Won Cho, Watervliet, NY (US); Ki-Il Kim, Clifton Park, NY (US); Kang Ill Seo, Springfield, VA (US)

(73) Assignee: SAMSUNG ELECTRONICS CO., LTD, Suwon-si (KR)

( * ) Notice: Subject to any disclaimer, the term of this patent is extended or adjusted under 35 U.S.C. 154(b) by 0 days.

(21) Appl. No.: 17/157,374

(22) Filed: Jan. 25, 2021

(65) Prior Publication Data

US 2022/0157737 A1    May 19, 2022

Related U.S. Application Data

(60) Provisional application No. 63/113,626, filed on Nov. 13, 2020.

(51) Int. Cl.
*H01L 23/544* (2006.01)
*H01L 23/48* (2006.01)
*H01L 23/00* (2006.01)

(52) U.S. Cl.
CPC .......... *H01L 23/544* (2013.01); *H01L 23/481* (2013.01); *H01L 24/83* (2013.01); *H01L 2223/54426* (2013.01); *H01L 2224/8313* (2013.01)

(58) Field of Classification Search
CPC ................. H01L 23/544; H01L 23/481; H01L 2223/54426; H01L 2224/8313; H01L 2223/54453; H01L 2223/5442; H01L 21/76898; H01L 2224/8013; H01L 21/823475; G03F 7/70663
USPC .................................................. 257/621, 622
See application file for complete search history.

(56) References Cited

U.S. PATENT DOCUMENTS

| 6,372,600 | B1 | 4/2002 | Desko et al. |
| 8,546,961 | B2 | 10/2013 | Farooq et al. |
| 8,669,643 | B2 * | 3/2014 | Takano .................. C25D 1/003 |
| | | | 257/532 |
| 8,778,805 | B2 * | 7/2014 | Fujii .................... H01L 23/5226 |
| | | | 257/E21.231 |

(Continued)

FOREIGN PATENT DOCUMENTS

EP   3 324 436 A1   5/2018
JP   2004-319637 A   11/2004

OTHER PUBLICATIONS

Communication dated Mar. 15, 2022 issued by the European Patent Office in counterpart European Application No. 21206428.1.

*Primary Examiner* — Khiem D Nguyen
(74) *Attorney, Agent, or Firm* — Sughrue Mion, PLLC

(57) ABSTRACT

Provided is a semiconductor architecture including a carrier substrate, alignment marks provided in the carrier substrate, the alignment marks being provided from a first surface of the carrier substrate to a second surface of the carrier substrate, a first semiconductor device provided on the first surface of the carrier substrate based on the alignment marks, a second semiconductor device provided on the second surface of the carrier substrate based on the alignment marks and aligned with the first semiconductor device.

10 Claims, 18 Drawing Sheets

(56) References Cited

U.S. PATENT DOCUMENTS

| | | | |
|---|---|---|---|
| 8,895,404 B2 | 11/2014 | Wang et al. | |
| 8,957,504 B2 * | 2/2015 | Chao-Yuan | H01L 23/522 |
| | | | 257/E21.597 |
| 9,184,041 B2 * | 11/2015 | Chen | H01L 27/10829 |
| 9,287,355 B2 * | 3/2016 | Oyu | H01L 29/407 |
| 9,570,395 B1 * | 2/2017 | Sengupta | H01L 23/535 |
| 10,777,454 B2 | 9/2020 | Purushothaman et al. | |
| 11,227,812 B2 * | 1/2022 | Chen | H01L 25/50 |
| 2003/0127751 A1 | 7/2003 | Yamada et al. | |
| 2008/0179678 A1 * | 7/2008 | Dyer | H01L 27/1203 |
| | | | 438/154 |
| 2009/0225331 A1 | 9/2009 | Van Haren | |
| 2010/0224876 A1 * | 9/2010 | Zhu | H01L 23/481 |
| | | | 257/E21.597 |
| 2011/0177435 A1 * | 7/2011 | Herrin | H01L 23/544 |
| | | | 430/5 |
| 2012/0001337 A1 * | 1/2012 | Tsai | H01L 21/76877 |
| | | | 257/E23.161 |
| 2012/0193785 A1 * | 8/2012 | Lin | H01L 21/76229 |
| | | | 257/737 |
| 2012/0295433 A1 * | 11/2012 | Su | G06F 30/39 |
| | | | 438/585 |
| 2013/0214337 A1 | 8/2013 | Kashihara | |
| 2017/0176871 A1 | 6/2017 | Van Buel et al. | |
| 2017/0207214 A1 * | 7/2017 | Or-Bach | H01L 27/0694 |
| 2019/0123035 A1 | 4/2019 | Carothers | |
| 2019/0131172 A1 * | 5/2019 | Chang | H01L 21/6835 |
| 2019/0363001 A1 * | 11/2019 | Or-Bach | H01L 27/0207 |
| 2020/0098737 A1 | 3/2020 | Sharma et al. | |

* cited by examiner

THREE DIMENSIONAL INTEGRATED SEMICONDUCTOR ARCHITECTURE HAVING ALIGNMENT MARKS PROVIDED IN A CARRIER SUBSTRATE

CROSS-REFERENCE TO THE RELATED APPLICATION

This application is based on and claims benefit to U.S. Provisional Application No. 63/113,626 filed on Nov. 13, 2020 in the U.S. Patent and Trademark Office, the disclosure of which is incorporated herein in its entirety by reference.

BACKGROUND

1. Field

Example embodiments of the present disclosure relate to a method of manufacturing a three-dimensional (3D) heterogeneous integrated semiconductor architecture and an apparatus thereof, and more particularly to a method of improving alignment accuracy by using a stopper layer in manufacturing a 3D heterogeneous integrated semiconductor architecture and an apparatus thereof.

2. Description of Related Art

Based on the development of electronic technology and with the recent down-scaling of semiconductor devices, a 3D heterogeneous integration of semiconductor devices is being developed. The 3D integration of semiconductor devices in a semiconductor architecture may down scale an area of the semiconductor architecture and reduce the power consumption of the semiconductor architecture.

However, there are difficulties in manufacturing 3D integrated semiconductor architectures because manufacturing the 3D integrated semiconductor architectures requires using both of the first side and the second side of a semiconductor wafer for integration. The second side integration of a semiconductor device is performed based on alignment marks provided on a first side. However, it may be difficult to use the first side alignment marks during the second side integration process due to the weak alignment mark signals. Thus, aligning the semiconductor device integrated on the first side of the wafer with another semiconductor device integrated on the second side of the wafer accurately for high overlay performance between integrations on the two sides of the wafer may be difficult.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

One or more example embodiments provide a method of manufacturing a 3D heterogeneous integrated semiconductor architecture and an apparatus thereof.

One or more example embodiments also provide to a method of improving alignment accuracy in manufacturing a 3D heterogeneous integrated semiconductor architecture and an apparatus thereof.

According to an aspect of an example embodiment, there is provided a semiconductor architecture including a carrier substrate, alignment marks provided in the carrier substrate, the alignment marks being provided from a first surface of the carrier substrate to a second surface of the carrier substrate, a first semiconductor device provided on the first surface of the carrier substrate based on the alignment marks, a second semiconductor device provided on the second surface of the carrier substrate based on the alignment marks and aligned with the first semiconductor device.

According to another aspect of an example embodiment, there is provided a method of manufacturing a semiconductor architecture, the method including providing a first wafer comprising a carrier substrate and a sacrificial layer, providing a stopper layer in the first wafer, providing alignment marks in the carrier substrate from a first surface of the carrier substrate to a first surface of the stopper layer, providing a first semiconductor device on the first surface of the carrier substrate based on locations of alignment marks provided on the first surface of the carrier substrate, providing a second wafer on a first surface of the first semiconductor device, removing the sacrificial layer, removing the stopper layer, and providing a second semiconductor device on a second surface of the carrier substrate based on locations of the alignment marks provided on the second surface of the carrier substrate.

According to another aspect of an example embodiment, there is provided a semiconductor architecture including a wafer, alignment marks provided in the wafer, the alignment marks being openings provided from a first surface of the wafer to a second surface of the wafer that is opposite to the first surface, a first semiconductor device provided on the first surface of the wafer based on the alignment marks, and a second semiconductor device provided on the second surface of the wafer based on the alignment marks and aligned with the first semiconductor device.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
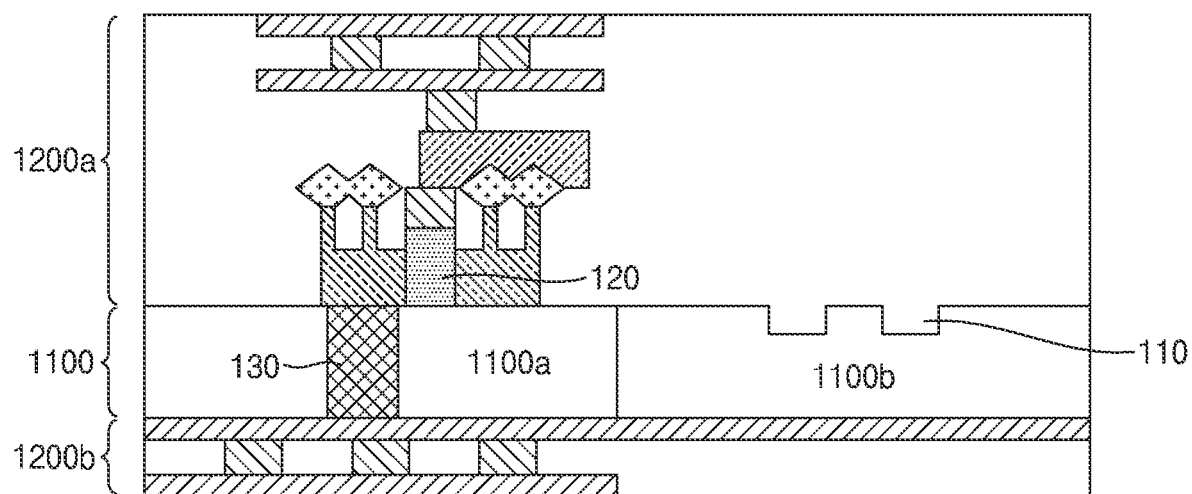
FIG. 1 illustrates a cross-sectional view of a semiconductor architecture according to a related embodiment.

The example embodiments described herein are examples, and thus, the present disclosure is not limited thereto, and may be realized in various other forms. Each of the example embodiments provided in the following description is not excluded from being associated with one or more features of another example or another example embodiment also provided herein or not provided herein but consistent with the present disclosure. For example, even if matters described in a specific example or example embodiment are not described in a different example or example embodiment thereto, the matters may be understood as being related to or combined with the different example or embodiment, unless otherwise mentioned in descriptions thereof.

In addition, it should be understood that all descriptions of principles, aspects, examples, and example embodiments are intended to encompass structural and functional equivalents thereof. In addition, these equivalents should be understood as including not only currently well-known equivalents but also equivalents to be developed in the future, that is, all devices invented to perform the same functions regardless of the structures thereof.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," "top," and "bottom," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms "first," "second," "third," "fourth," etc. may be used herein to describe various elements, these elements should not be limited by these terms. These terms are only used to distinguish one element from another element. Thus, a first element discussed below could be termed a second element without departing from the teachings of the present disclosure.

It will be also understood that, even if a certain step or operation of manufacturing an apparatus or structure is described later than another step or operation, the step or operation may be performed later than the other step or operation unless the other step or operation is described as being performed after the step or operation.

Example embodiments are described herein with reference to cross-sectional illustrations that are schematic illustrations of the example embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure. Further, in the drawings, the sizes and relative sizes of layers and regions may be exaggerated for clarity.

For the sake of brevity, general elements to semiconductor devices may or may not be described in detail herein.

FIG. 1 illustrates a cross-sectional view of a semiconductor architecture according to a related embodiment.

Referring the FIG. 1, the semiconductor architecture 11 may include a wafer including a carrier substrate 1100. The carrier substrate 1100 may include a device area 1100a and an alignment mark area 1100b. The alignment mark area 1100b includes alignment marks 110 that are formed on the first surface of the carrier substrate 1100 at a predetermined depth.

As illustrated in FIG. 1, the semiconductor architecture 11 also includes a first semiconductor device 1200a provided on a first surface of the carrier substrate 1100. The first semiconductor device 1200a may be an integrated circuit including components such as, for example, a buried power rails (BPR) 120. The BPR 120 may be provided on the first surface of the carrier substrate 1100. The semiconductor architecture 11 may also include a second semiconductor device 1200b provided on a second surface of the carrier substrate 1100. Components such as, for example, a through-silicon via (TSV) 130 may protrude from the second semiconductor device 1200b. The TSV 130 may be formed to penetrate the carrier substrate 1100. The second semiconductor device 1200b may be provided on the second surface of the carrier substrate 1100 to be aligned with the first semiconductor device 1200a based on locations of the alignment marks 110. For example, the second semiconductor device 1200b may be provided on the second surface of the carrier substrate 1100 such that the TSV 130 of the second semiconductor device 1200b is aligned with a component such as, for example, the BPR 120 of the first semiconductor device 1200a.

As illustrated in FIG. 1, the TSV 130 of the second semiconductor device 1200b may not be properly aligned with the BPR 120 of the first semiconductor device 1200a. Thus, a misalignment may occur between the first semiconductor device 1200a and the second semiconductor device 1200b which may deteriorate performance of the semiconductor architecture 11.

FIGS. 2A through 2G illustrate a method of manufacturing a semiconductor architecture as illustrated in FIG. 1 according to a related embodiment.

Figure 2A:
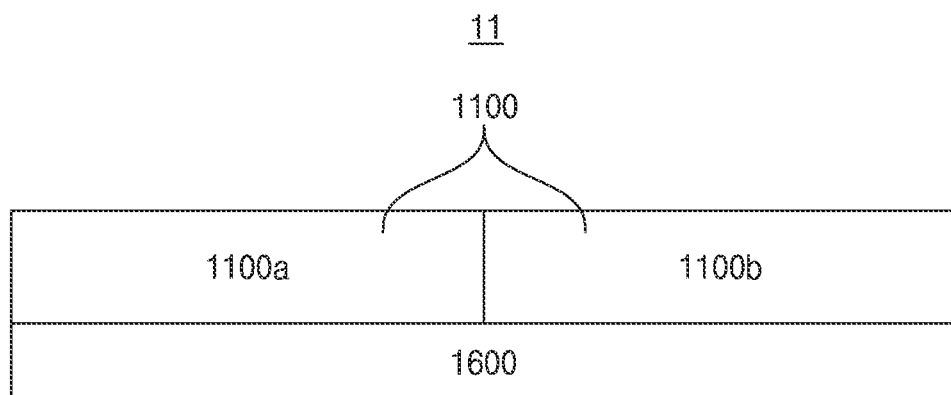
FIGS. 2A, 2B, 2C, 2D, 2E, 2F, and 2G illustrate a method of manufacturing a semiconductor architecture as illustrated in FIG. 1 according to a related embodiment.

Referring to FIG. 2A, the method may include providing a wafer including a carrier substrate 1100 including a device area 1100a and an alignment mark area 1100b, and a sacrificial layer 1600.

Figure 2B:
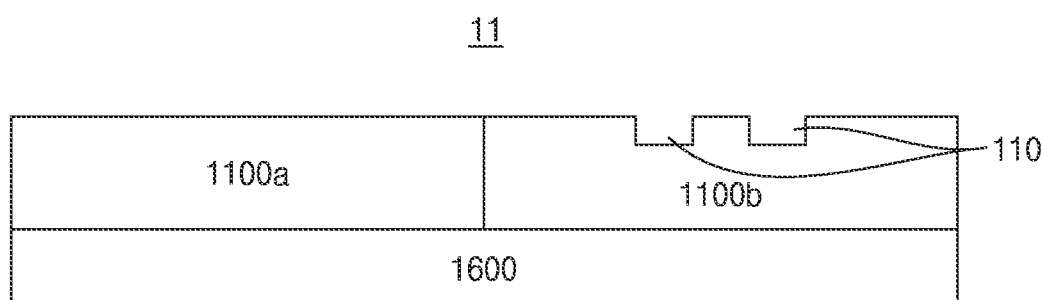
Figure 2C:
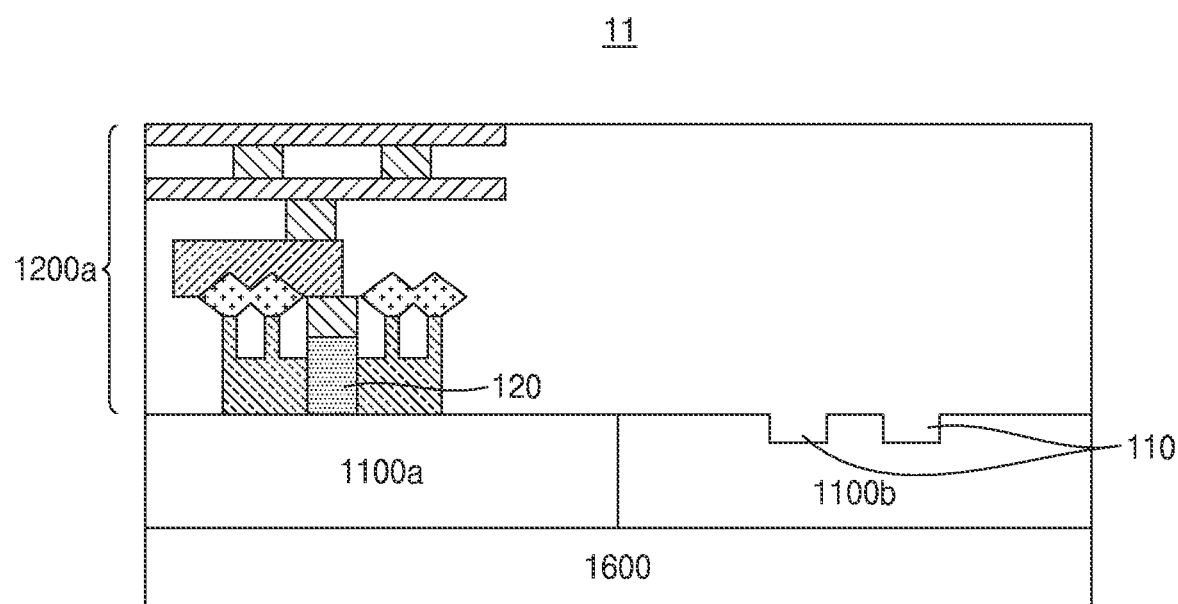

As illustrated in FIG. 2B, alignment marks 110 may be formed on a first surface of the carrier substrate 1100 at a certain depth in a vertical direction.

A first semiconductor device 1200a may be provided on a first surface of the carrier substrate 1100 based on the alignment marks 110. The first semiconductor device 1200a may be an integrated circuit including components such as, for example, a BPR 120. The BPR 120 may be provided on the first surface of the carrier substrate 1100.

Figure 2D:
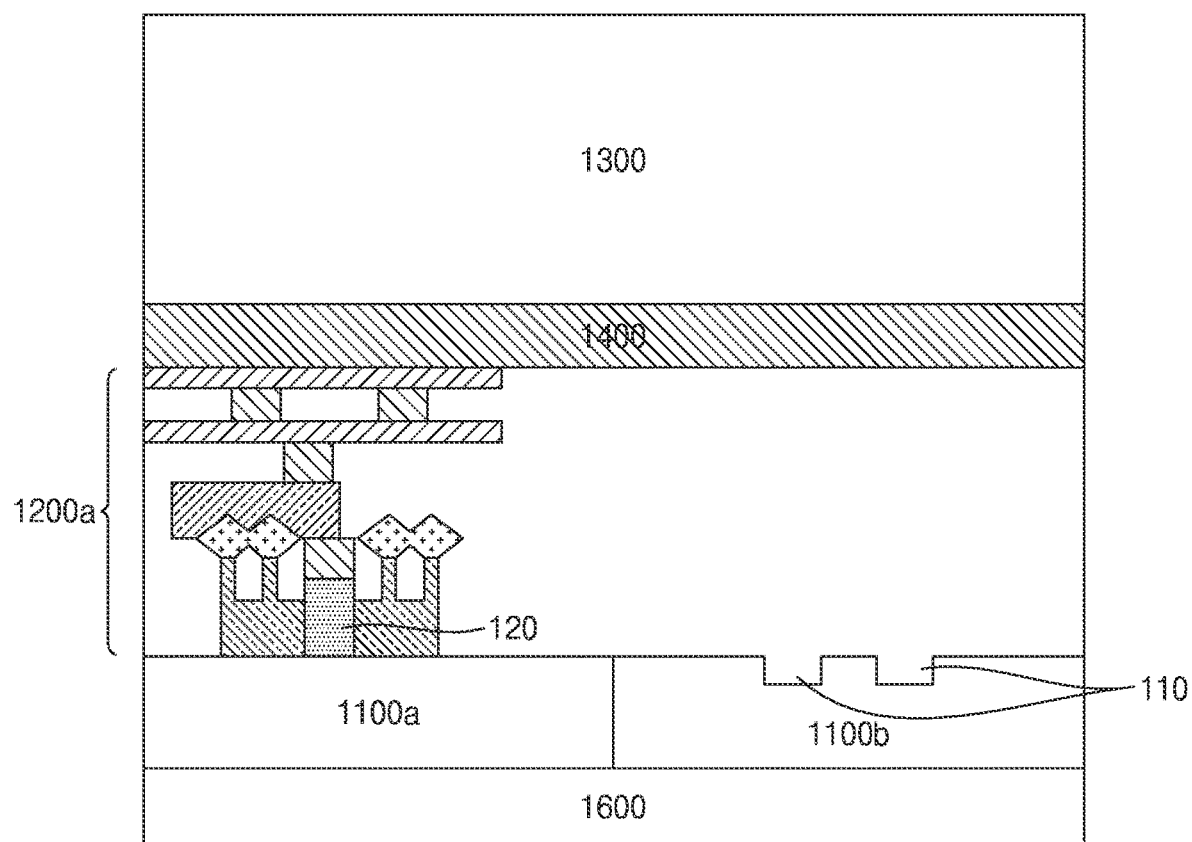
Figure 2E:
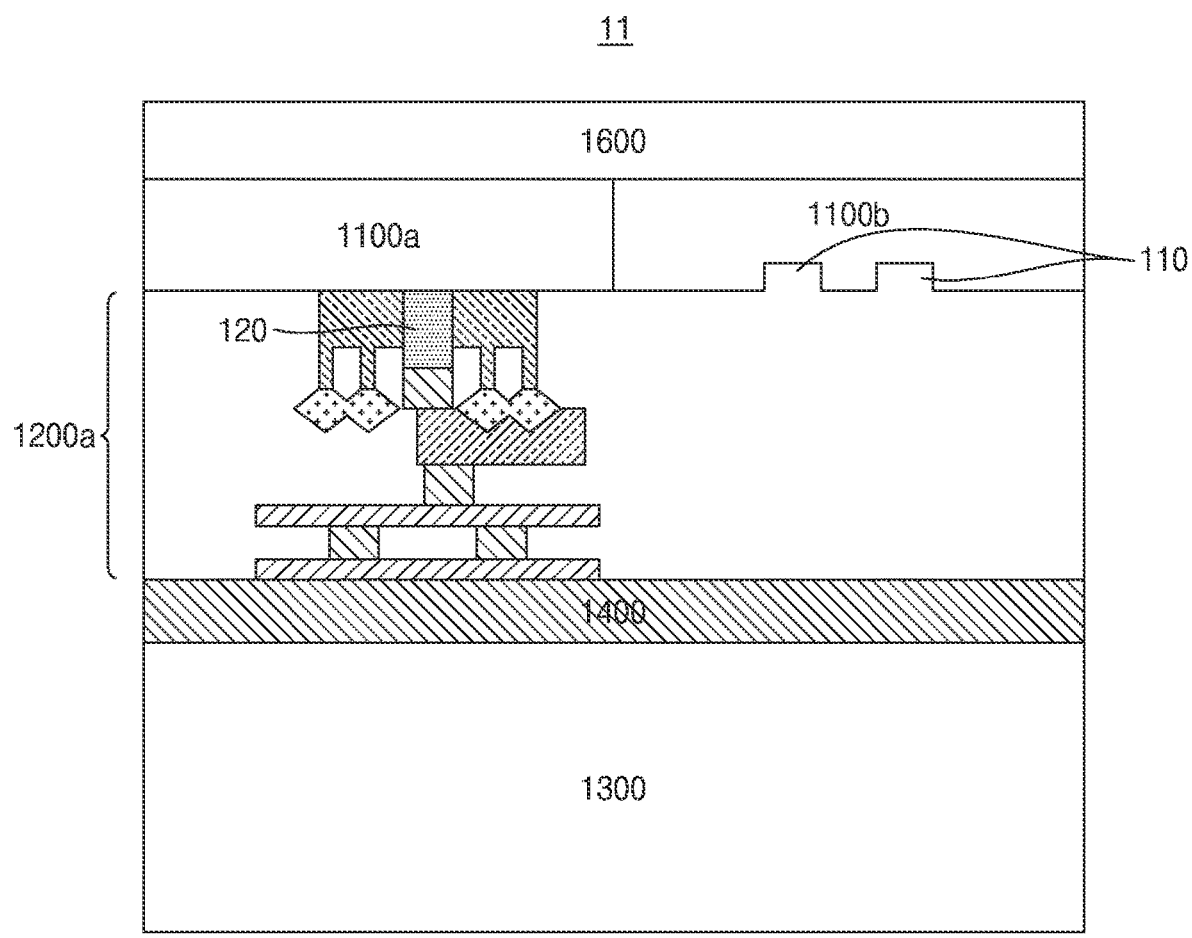

Referring to FIG. 2D, a wafer-to-wafer bonding process may be carried out. For example, a second wafer 1300 may be provided on a first surface of the first semiconductor device 1200a. The second wafer 1300 may be bonded by an adhesive layer 1400 provided between the first semiconductor device 1200a and the second wafer 1300. The semiconductor architecture 11 is flipped as illustrated in FIG. 2E.

Figure 2F:
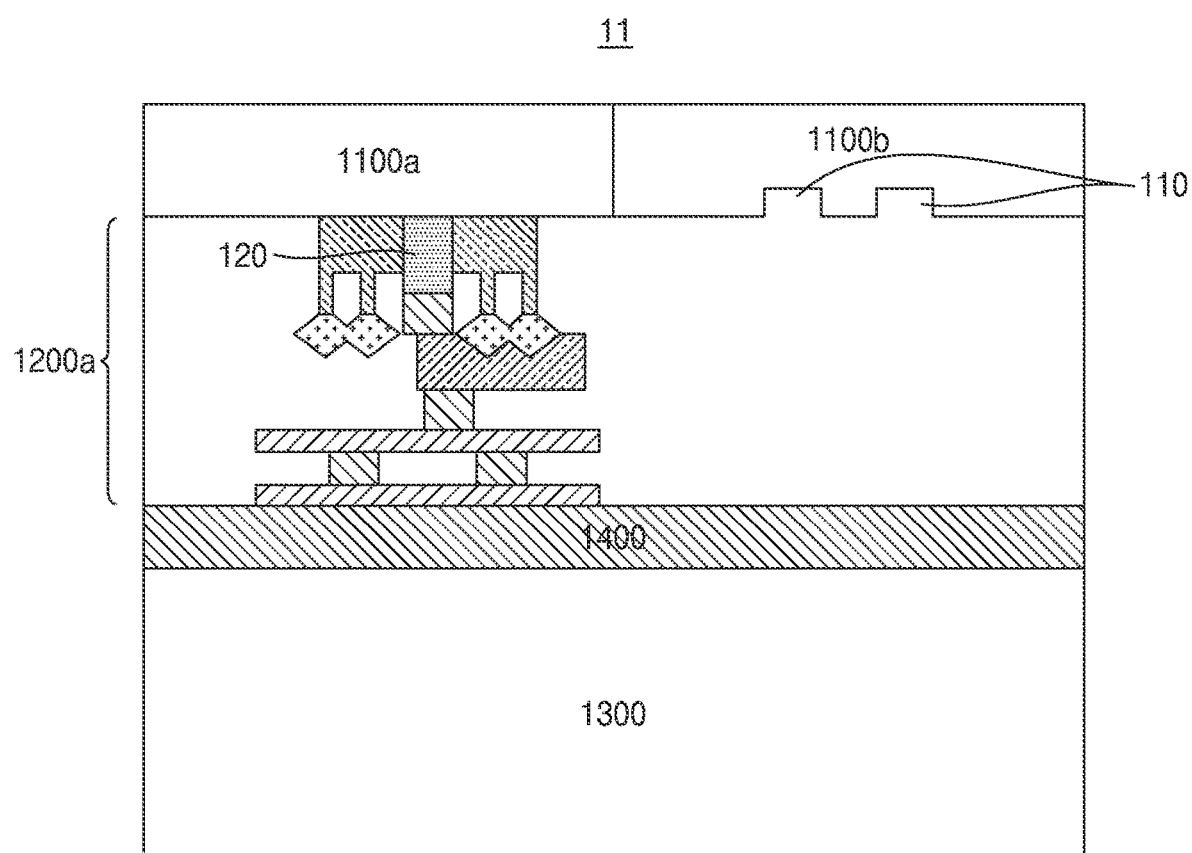
Figure 2G:
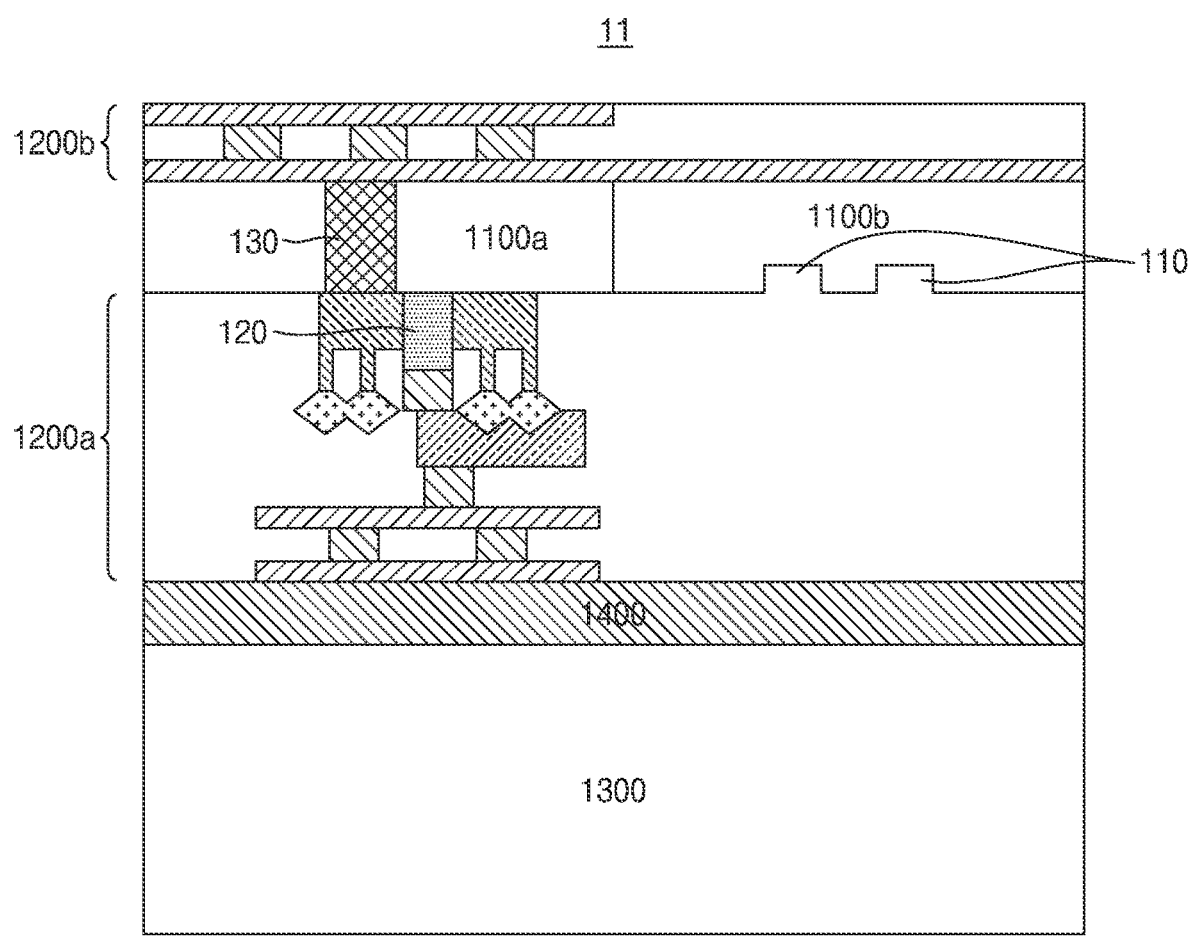

Referring to FIG. 2F, the sacrificial layer 1600 may be removed. As illustrated in FIG. 2G, a second semiconductor device 1200b may be provided on the second surface of the carrier substrate 1100 based on the locations of the alignment marks 110 provided on the first surface of the carrier substrate 1100. The second semiconductor device 1200b may be an integrated circuit including components such as, for example, a TSV 130. The TSV 130 may be formed to penetrate the carrier substrate 1100. The second semiconductor device 1200b may be provided on the second surface of the carrier substrate 1100 based on the alignment marks 110.

However, as illustrated in FIG. 2G, there may be a misalignment between the first semiconductor device 1200a and the second semiconductor device 1200b. For example, the TSV 130 may be misaligned with the BPR 120. Due to the relatively low depth of the alignment marks 110 provided on the first surface of the carrier substrate 1100, it may be difficult to accurately detect the locations of the alignment marks 110 from the second surface of the carrier substrate 1100 when providing the second semiconductor device 1200b. The alignment marks 110 may include alignment marks detected by a litho-scanning method and/or alignment marks (overlay marks) detected by using an overlay tool. The signals provided by the alignment marks 110 from the second side of the carrier substrate 1100 may be weak due to the low depth of the alignment marks 110. Thus, accurate detection of locations of the alignment marks from the second side of the carrier substrate 1100 may be difficult. Due to the misalignment between the first semiconductor device 1200a and the second semiconductor device 1200b, the performance of the semiconductor architecture 11 may be deteriorated.

Figure 3:
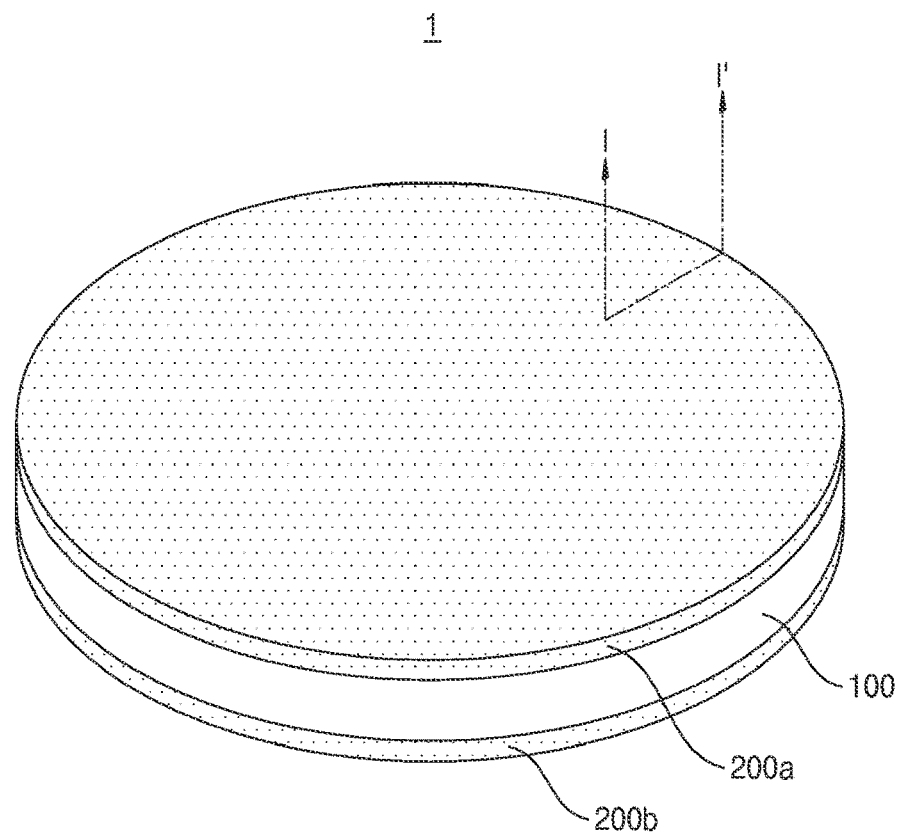
FIG. 3 illustrates a perspective view of a 3D heterogeneous integrated semiconductor architecture according to an example embodiment.

FIG. 3 illustrates a perspective view of a 3D heterogeneous integrated semiconductor architecture according to an example embodiment.

As illustrated in FIG. 3, the 3D heterogeneous integrated semiconductor architecture 1 may include a carrier substrate 100, a first semiconductor device 200a provided on a first surface of the carrier substrate 100, and a second semiconductor device 200b provided on a second surface of the carrier substrate 100, opposite to the first semiconductor device 200a. The first semiconductor device 200a and the second semiconductor device 200b may be integrated to each other and may form a 3D heterogeneous integrated semiconductor architecture 1.

The carrier substrate 100 may include, for example, a silicon (Si) substrate, a glass substrate, a sapphire substrate, etc. However, embodiments are not limited thereto. As illustrated in FIG. 3, the carrier substrate 100 may be a circular panel, but the shape of the carrier substrate 100 is not limited thereto. For example, the carrier substrate 100 may be a tetragonal panel. The carrier substrate 100 may include a single layer or multiple layers.

Figure 4:
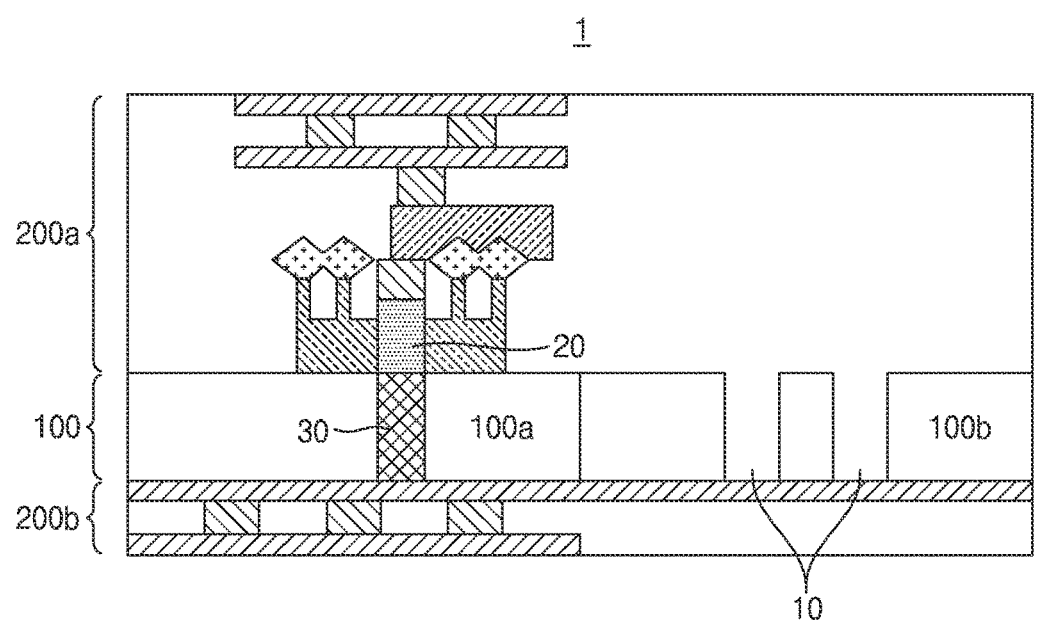
FIG. 4 illustrates a cross-sectional view taken along line I-I' of FIG. 3 according to an example embodiment.

FIG. 4 illustrates a cross-sectional view taken along line I-I' of FIG. 3 according to an example embodiment.

Referring the FIG. 4 the 3D heterogeneous integrated semiconductor architecture 1 may include a carrier substrate 100. The carrier substrate 100 includes a device area 100a and an alignment mark area 100b. The alignment mark area 100b includes alignment marks 10 that may be formed from the first surface of the carrier substrate 100 to the second surface of the carrier substrate 100.

The 3D heterogeneous integrated semiconductor architecture 1 also includes a first semiconductor device 200a formed on a first surface of the carrier substrate 100 and a second semiconductor device 200b provided on a second surface of the carrier substrate 100. For example, the first semiconductor device 200a may be an integrated circuit including components such as, for example, a BPR 20. The BPR 20 may be provided to face the first surface of the carrier substrate 100. The second semiconductor device 200b may be another integrated circuit and components such as, for example, a TSV 30 may protrude from the second semiconductor device 200b. The TSV 30 may be formed to penetrate the carrier substrate 100.

As illustrated in FIG. 4, the alignment between the BPR 20 and the TSV 30 may be improved as compared to the related embodiment, and the first semiconductor device 200a and the second semiconductor device 200b may be more accurately aligned with each other as compared to the related embodiment, due to improvements to the alignment marks 10 as will be discussed below. Based on the improved alignment of the first semiconductor device 200a and the second semiconductor device 200b, the integration and the performance of the semiconductor architecture 1 may be improved. Further, by providing semiconductor devices on both of the first surface of the carrier substrate 100 and the second surface of the carrier substrate 100, the size of the semiconductor architecture 1 may be reduced, and the power consumption may also be reduced.

FIGS. 5A through 5F illustrate a method of manufacturing a 3D heterogeneous integrated semiconductor architecture 1 according to an example embodiment.

Figure 5A:
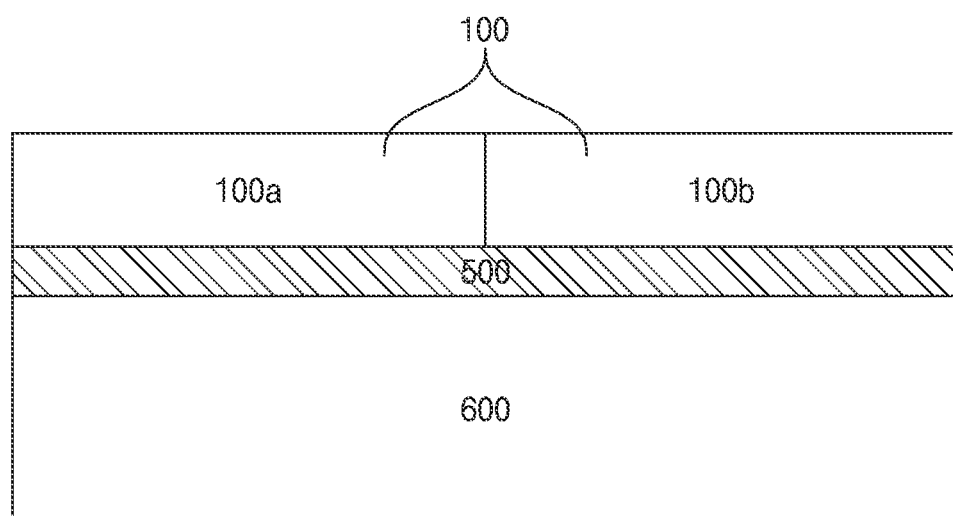
FIGS. 5A, 5B, 5C, 5D, 5E, 5F, and 5G illustrate a method of manufacturing a 3D heterogeneous integrated semiconductor architecture according to an example embodiment.

Referring to FIG. 5A, the method includes providing a wafer including a carrier substrate 100, a stopper layer 500, and a sacrificial layer 600. The carrier substrate 100 may include a device area 100a and an alignment mark area 100b. The alignment mark area 100b may be an area of the carrier substrate 100 where the alignment marks 10 are formed. The carrier substrate 100 may include, for example, a silicon (Si) substrate, a glass substrate, a sapphire substrate, etc. However, materials of the carrier substrate 100 are not limited thereto. The carrier substrate 100 may be provided as a circular panel, but the shape of the carrier substrate 100 is not limited thereto. For example, the carrier substrate 100 may be a tetragonal panel. The carrier substrate 100 may be provided as a single layer or multiple layers.

The sacrificial layer 600 may include a single layer or multiple layers. The sacrificial layer 600 may include a polymer material, an ultraviolet (UV) film, Si, or resin. However, materials of the sacrificial layer 600 are not limited thereto. According to an example embodiment, the sacrificial layer 600 may be omitted.

The stopper layer 500 may be, for example, a reactive-ion etching (ME) stopper layer. The stopper layer 500 may be formed on one of the carrier substrate 100 and the sacrificial layer 600. For example, the stopper layer 500 may be formed by epitaxial growth of a silicon germanium (SiGe) layer on the carrier substrate 100. However, embodiments are not limited thereto. According to another example embodiment, the stopper layer 500 may be an oxide layer formed in a silicon-on-insulator (SOI) wafer. For example, the stopper layer 500 may include silicon dioxide ($SiO_2$), Si, sapphire, etc. The stopper layer 500 may be a silicon nitride (SiN) layer according to another example embodiment.

Figure 5B:
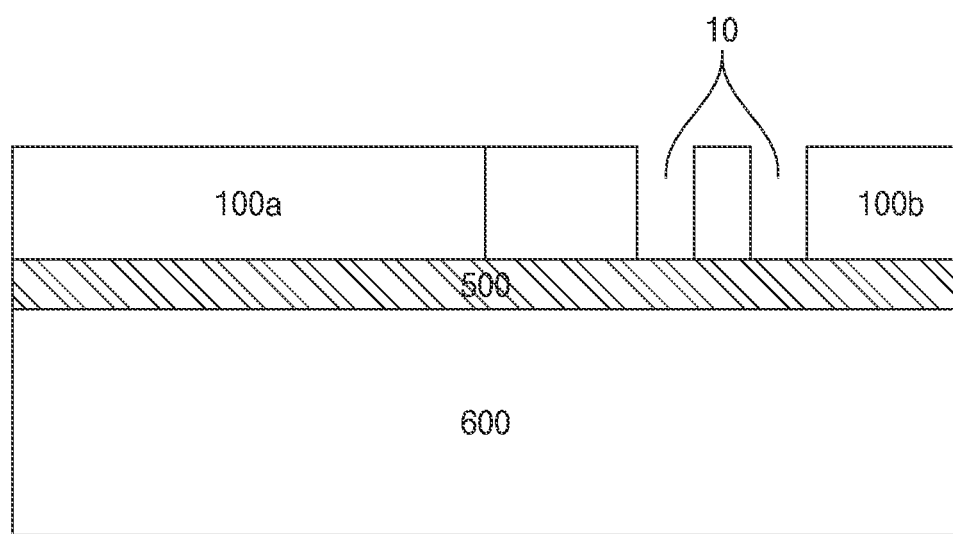

Referring to FIG. 5B, the method includes forming alignment marks 10 in the alignment mark area 100b of the carrier substrate 100 to a depth of the stopper layer 500. For example, the alignment marks 10 are provided to a level of a first surface of the stopper layer 500. The alignment marks 10 may be formed by etching openings or trenches on a first surface of the carrier substrate 100 to a first surface of the stopper layer 500. The etching may include dry etching or wet etching. However, embodiments are not limited thereto.

As illustrated in FIG. 5B, the second surface of the alignment marks 10 are coplanar with the first surface of the stopper layer 500. By forming the alignment marks 10 to the depth of the stopper layer 500, the uniformity of depths of the alignment marks 10 may be improved and alignment marks 10 may be formed at a deeper depth without damaging the wafer.

Figure 5C:
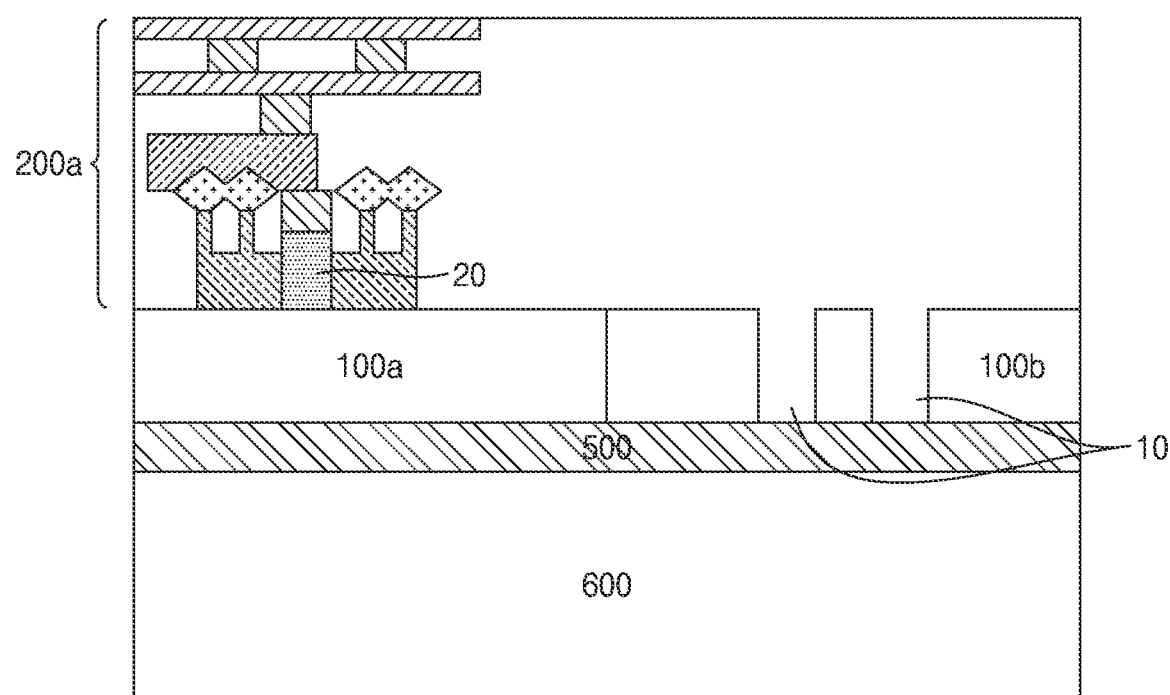

Referring to FIG. 5C, the method includes providing a first semiconductor device 200a on the first surface of the carrier substrate 100 based on the detected locations of the alignment marks 10. For example, the alignment marks 10 may include alignment marks detected by a litho-scanning method and overlay marks detected by using an overlay tool. The first semiconductor device 200a may be an integrated circuit including components such as, for example, a BPR 20. The BPR 20 may be provided on the first surface of the carrier substrate 100 when integrating the first semiconductor device 200a on the carrier substrate 100.

Figure 5D:
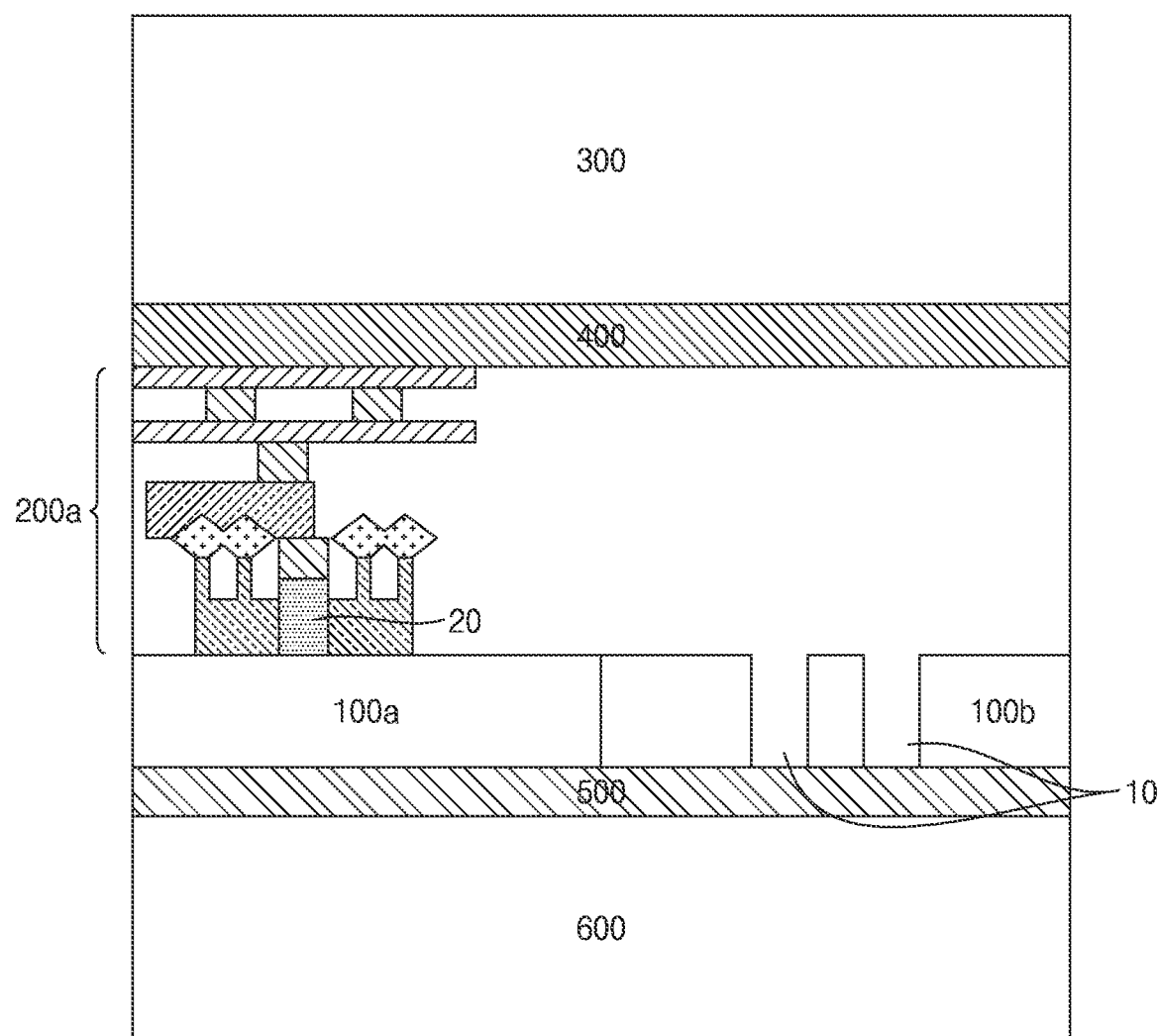

Referring to FIG. 5D, the method may include carrying out a wafer-to-wafer bonding process. For example, a second wafer 300 may be provided on a first surface of the first semiconductor device 200a. The second wafer 300 may be bonded to the first semiconductor device 200a by providing an adhesive layer 400 between the first semiconductor device 200a and the second wafer 300. However, embodiments are not limited thereto. According to another example embodiment, the second wafer 300 may be directly provided on the first semiconductor device 200a. For example, the second wafer 300 may be directly bonded to the first semiconductor device 200a by Si direct bonding without using an adhesive layer.

Figure 5E:
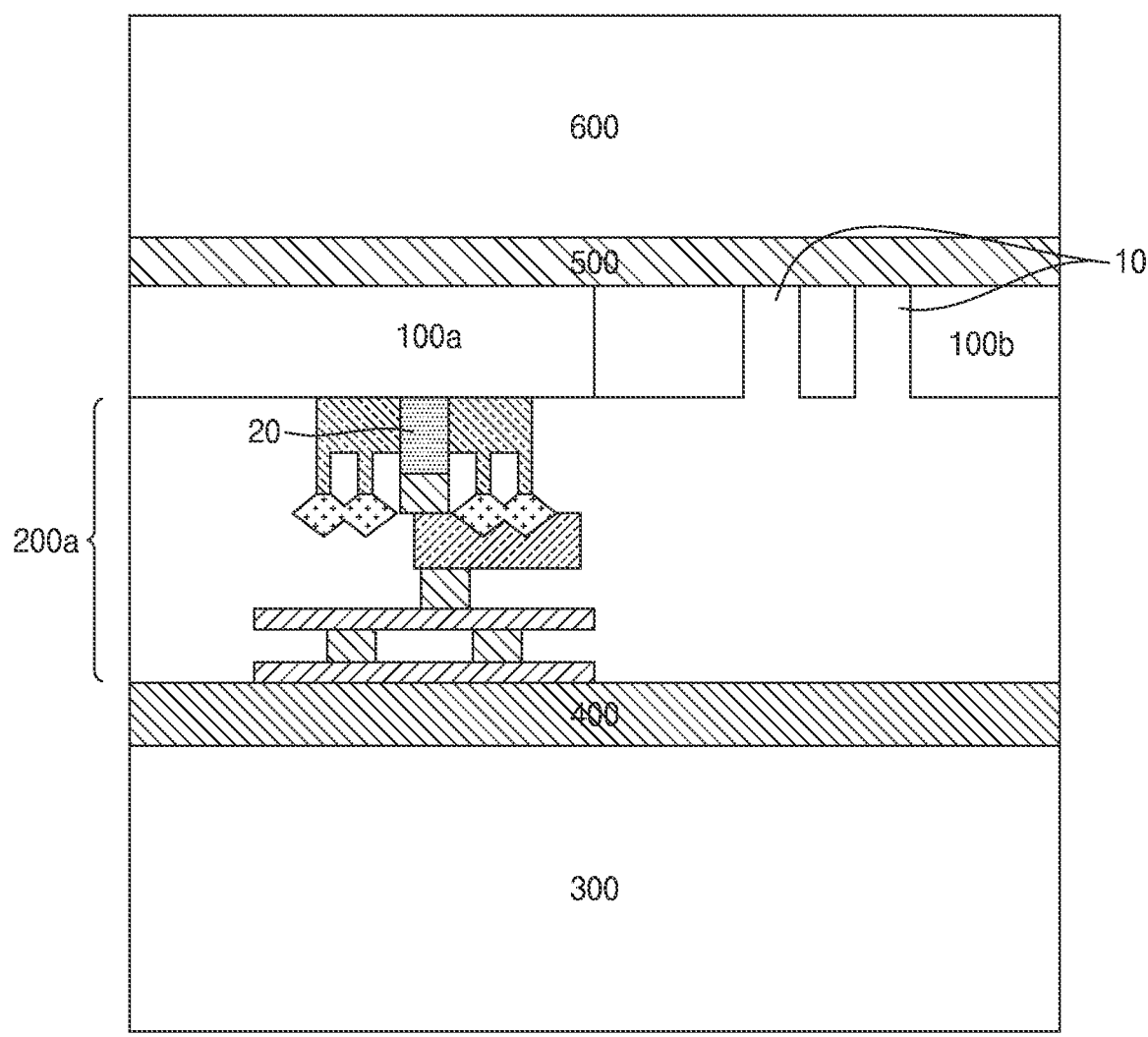

The semiconductor architecture 1 may be flipped as illustrated in FIG. 5E, for second side integration.

Figure 5F:
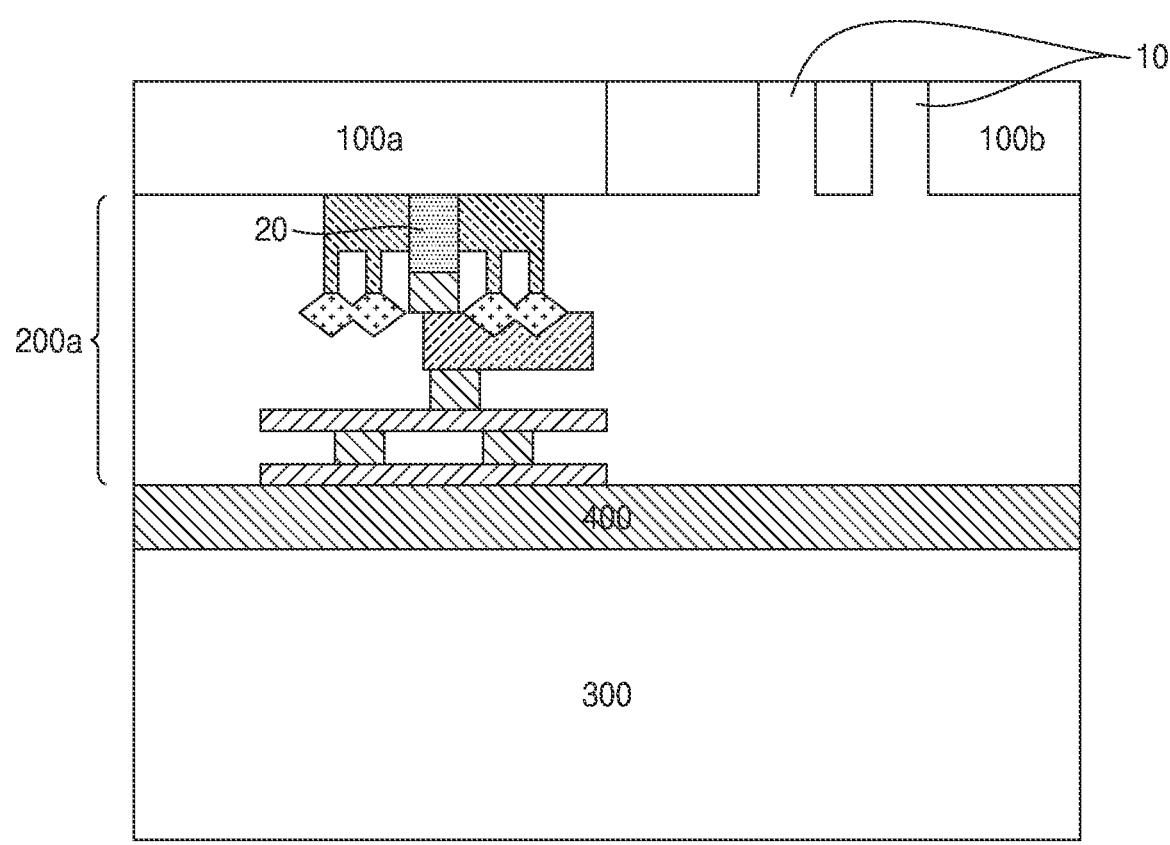

Referring to FIG. 5F, the method may include removing the sacrificial layer 600 to the level of the stopper layer 500 by a grinding process. The grinding process may include chemical-mechanical polishing (CMP) or dry etching, but embodiments are not limited thereto. The stopper layer 500 may be removed. The stopper layer 500 may be removed by etching such as, for example, dry etching. However, embodiments are not limited thereto.

Figure 5G:
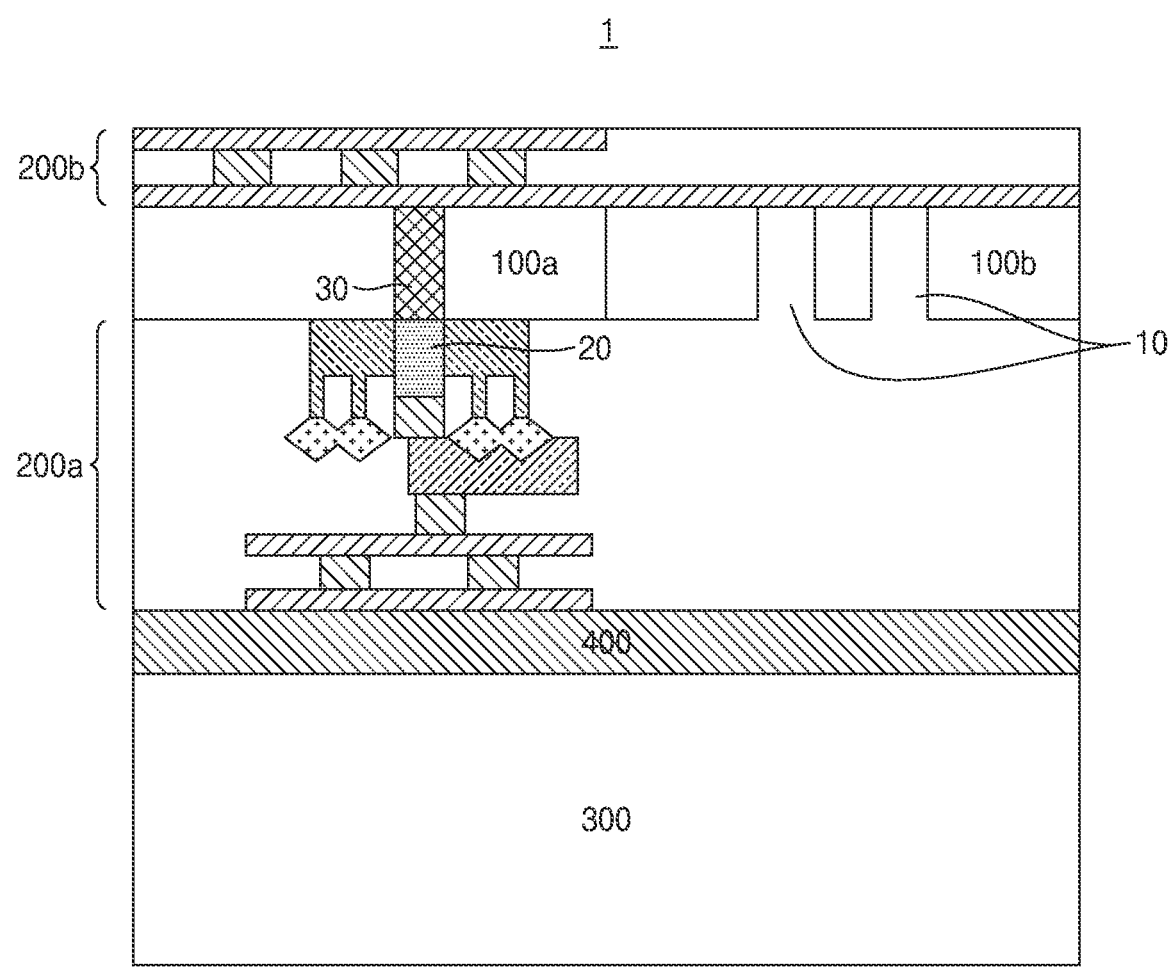

Referring to FIG. 5G, the method includes providing a second semiconductor device 200b on the second surface of the carrier substrate 100 based on the detected locations of the alignment marks 10. The alignment marks 10 on the second surface of the carrier substrate 100 may include alignment marks detected based on a litho-scanning method and overlay marks detected by using an overlay tool. As the alignment marks 10 are exposed on the second surface of the carrier substrate 100, the signals provided by the alignment marks 10 in the litho-scanning method and the overlay tool may be stronger, and thus, accuracy of the detection of alignment marks 10 may be improved.

As illustrated in FIG. 5G, the second semiconductor device 200b may be an integrated circuit and components such as, for example, a TSV 30 may protrude from the second semiconductor device 200b. The TSV 30 may be formed to penetrate through the carrier substrate 100. The second semiconductor device 200b may be integrated on the second surface of the carrier substrate 100 such that the TSV 30 of the second semiconductor device 200b is aligned with the BPR 20 of the first semiconductor device 200a based on the detected locations of the alignment marks 10.

As illustrated in FIG. 5G, as the detection of the location of alignment marks 10 becomes more accurate, the overall alignment and accuracy of overlay between the BPR 20 and the TSV 30 may be improved according to an example embodiment. Thus, the first semiconductor device 200a and the second semiconductor device 200b may be more accurately aligned with each other.

According to the example embodiment, based on the improved alignment between the first semiconductor device 200a and the second semiconductor device 200b, the integration and the performance of the semiconductor architecture 1 may be improved. In addition, 3D integration of semiconductor devices on both sides of the wafer may result in the reduction of size and power consumption of the semiconductor architecture 1.

Figure 6:
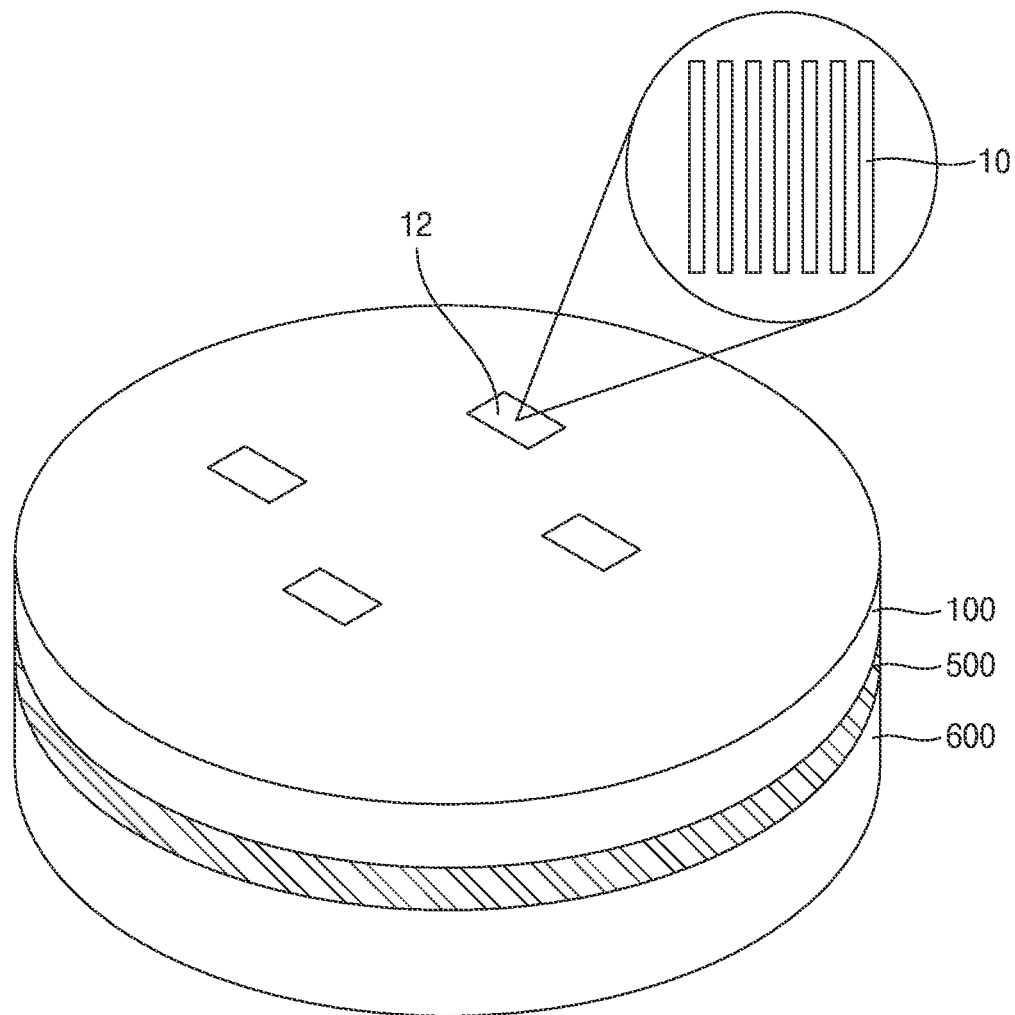
FIG. 6 illustrates a perspective view of the wafer in FIG. 5B according to an example embodiment.

FIG. 6 illustrates a perspective view of the wafer in FIG. 5B.

Referring to FIG. 6, the first surface of the carrier substrate 100 includes markers 12 provided in the alignment mark area 100b of the carrier substrate 100. As shown in the enlarged view of a marker 12, each marker 12 includes a plurality of alignment marks 10. As illustrated in FIG. 6, the alignment marks 10 may have rectangular shapes and may be provided one-dimensionally. The side surfaces of adjacent alignment marks 10 may be parallel to each other. For example, the alignment marks 10 may have a width of around 8 μm and a pitch of around 16 μm. However, the shape and size of the alignment marks 10 are not limited thereto. For example, the alignment marks 10 may have a cross shape. According to another example embodiment, the alignment marks 10 may be provided two-dimensionally. For example, the alignment marks 10 may have a rectangular shape and directions of the alignment marks 10 from a first plan view may be perpendicular to each other.

Figure 7A:
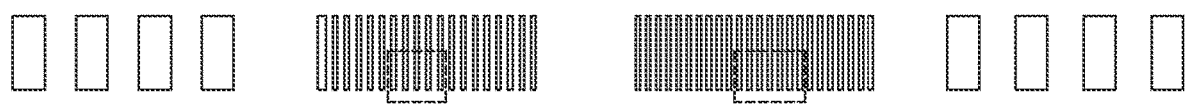
FIGS. 7A and 7B illustrate example top plan views of the marker in FIG. 5B.
Figure 7B:
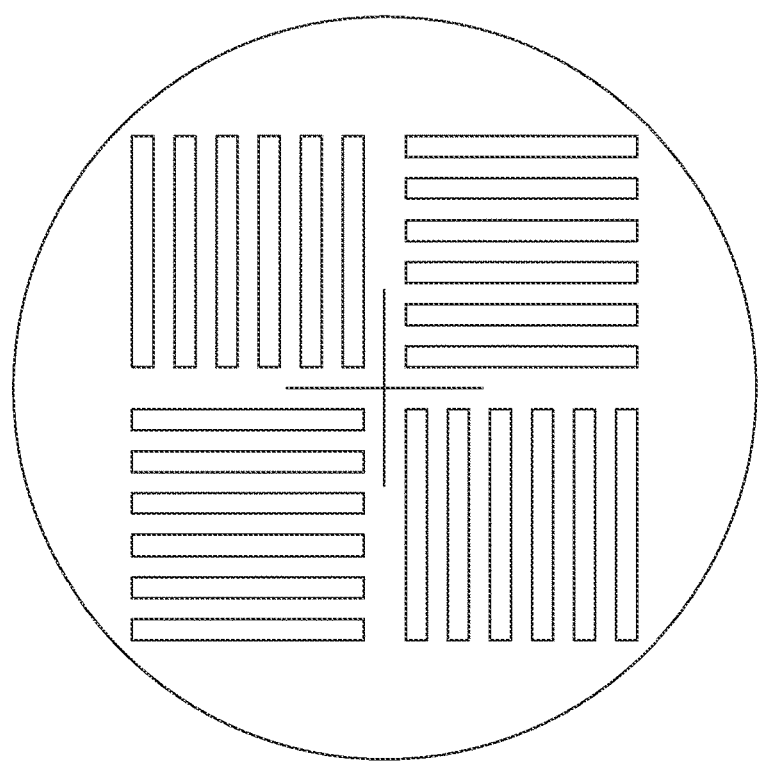

FIGS. 7A and 7B illustrate example top plan views of markers including alignment marks in FIG. 6 according to example embodiments.

Referring to FIG. 7A, the alignment marks 10 included in a marker 12 may have rectangular shapes and may be provided one-dimensionally. The alignment marks 10 may include alignment marks detected by a litho-scanning method and overlay marks detected by using an overlay tool.

Referring to FIG. 7B, according to another example embodiment, alignment marks 10 may be formed two-dimensionally in a marker 12. For example, groups of a plurality of alignment marks 10 may be provided to be perpendicular to each other as illustrated in FIG. 7B.

Figure 8:
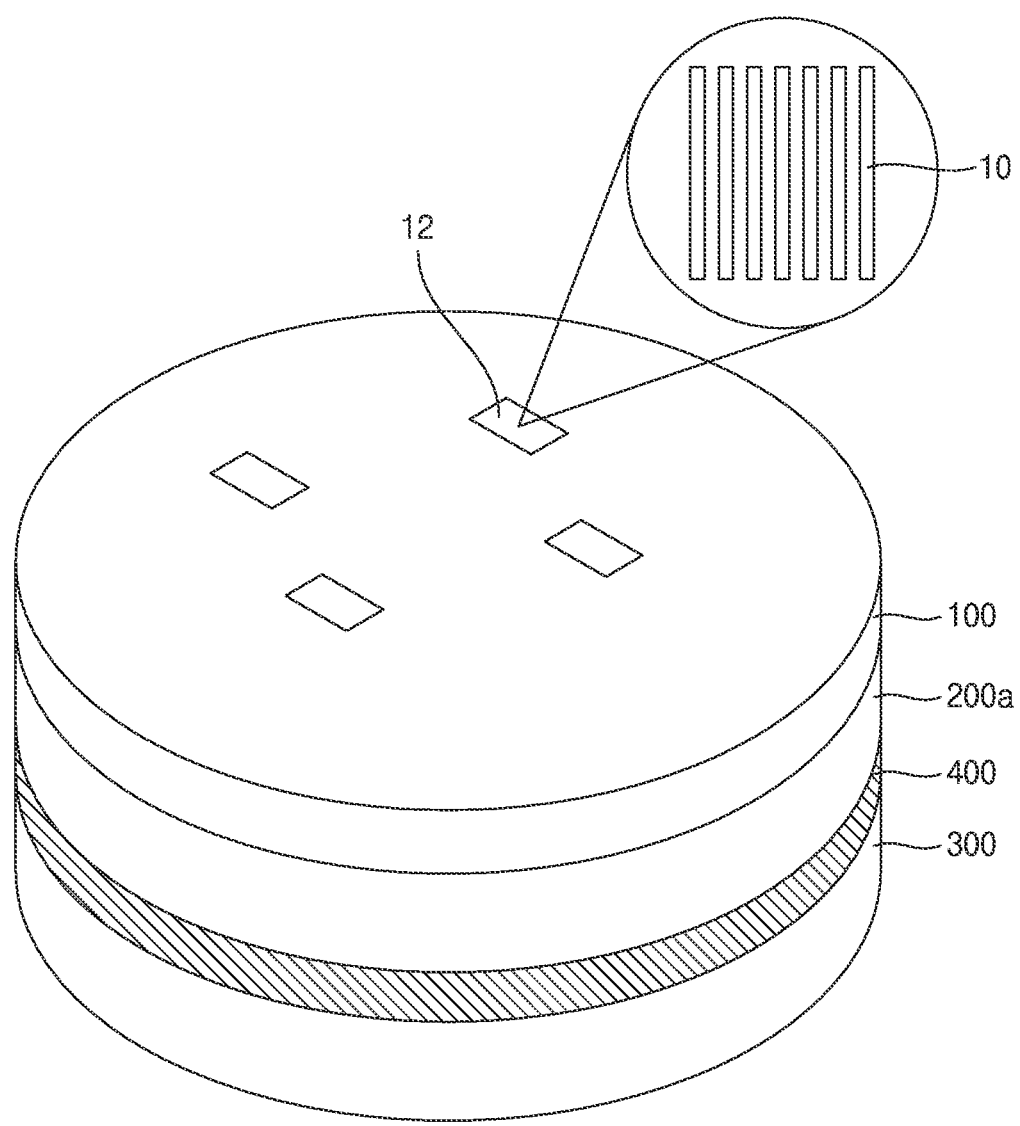
FIG. 8 illustrates a perspective view of the wafer in FIG. 5F.

FIG. 8 illustrates a perspective view of the semiconductor architecture 1 in which the stopper layer 500 is removed in FIG. 5F.

As illustrated in FIG. 8, the alignment marks 10 may be exposed on the second surface of the carrier substrate 100. The shape and size of the alignment marks 10 correspond to the shape and size of the alignment marks 10 described with respect to FIGS. 6, 7A, and 7B. For example, each alignment marker 12 may include a plurality of alignment marks 10. The alignment marks 10 may have rectangular shapes and may be provided one-dimensionally. The side surfaces of adjacent alignment marks 10 may be parallel to each other. For example, the alignment marks 10 may have a width of around 8 μm and a pitch of around 16 μm. However, the shape and size of the alignment marks 10 are not limited thereto. For example, the alignment marks 10 may have a cross shape. According to another example embodiment, the alignment marks 10 may be provided two-dimensionally.

Figure 9:
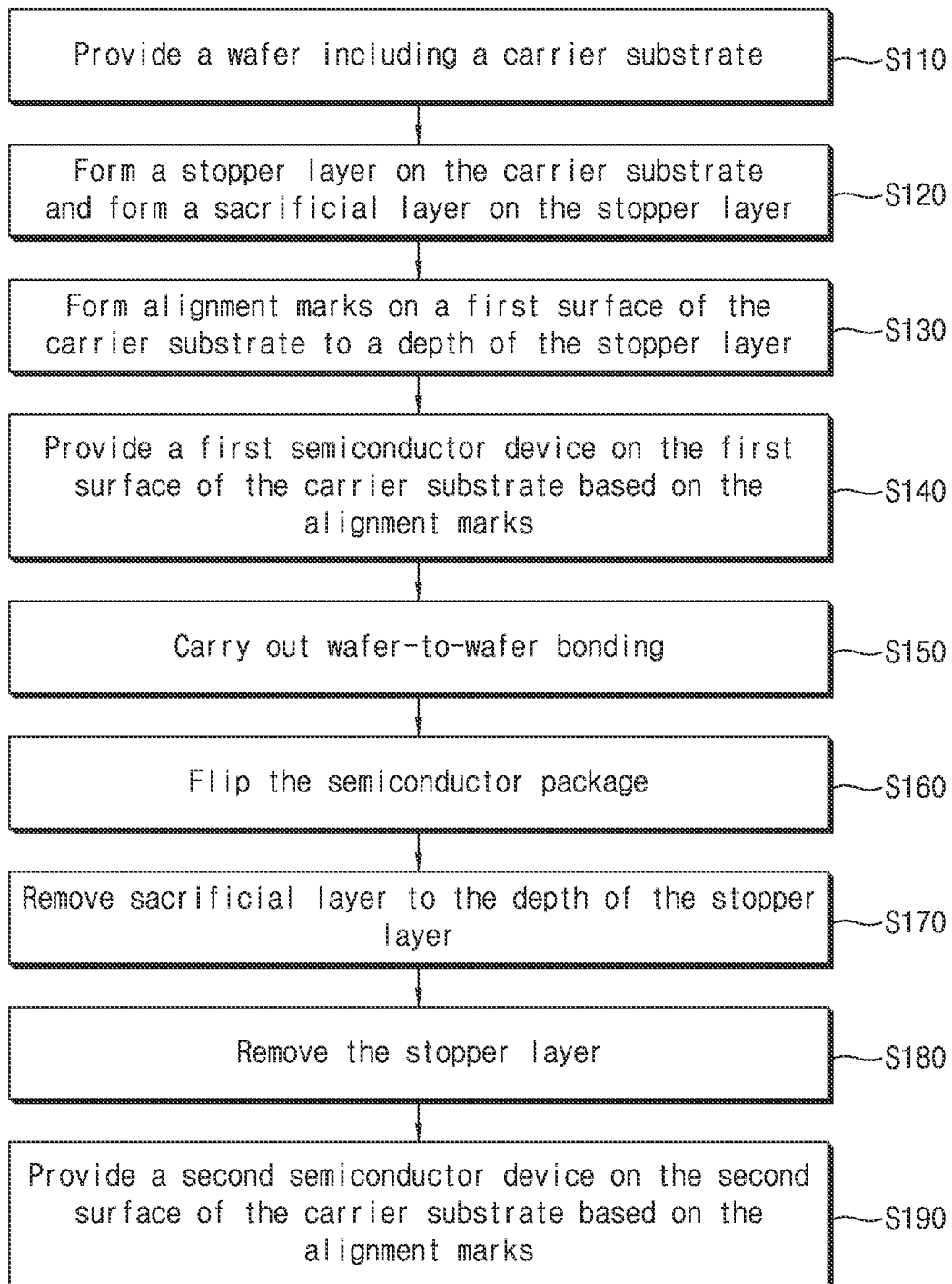
FIG. 9 illustrates a flow chart of a method of manufacturing a 3D heterogeneous integrated semiconductor architecture according to an example embodiment.

FIG. 9 illustrates a flow chart of a method of manufacturing a 3D heterogeneous integrated semiconductor architecture according to an example embodiment.

According to an example embodiment, a wafer including a carrier substrate is provided (S110). The carrier substrate may include a device area and an alignment mark area. The alignment mark area may be an area of the carrier substrate where the alignment marks are formed. The carrier substrate may include, for example, a silicon (Si) substrate, a glass substrate, a sapphire substrate, etc. However, materials of the carrier substrate are not limited thereto. The carrier substrate may be provided as a circular panel, but the shape of the carrier substrate is not limited thereto. For example, the carrier substrate may be a tetragonal panel. The carrier substrate may be provided as a single layer or multiple layers.

A stopper layer is formed on the carrier substrate and a sacrificial layer is formed on the stopper layer (S120). For example, the stopper layer may be formed by epitaxial growth of a silicon germanium (SiGe) layer on a carrier substrate. However, embodiments are not limited thereto. For example, the stopper layer may be an oxide layer formed in a silicon-on-insulator (SOI) wafer. According to another example embodiment, the stopper layer may be a silicon nitride (SiN) layer.

Alignment marks are formed on a first surface of the carrier substrate to the depth of the stopper layer (S130). The alignment marks may be etched in the alignment marks areas provided in the first surface of the carrier substrate. The alignment marks may be formed by etching openings or trenches on a first surface of the carrier substrate to the depth of the stopper layer. Thus, a second surface of the alignment marks and a first surface of the stopper layer may be coplanar. The etching may include dry etching or wet etching. However, embodiments are not limited thereto.

The first surface of the carrier substrate may include markers provided in the alignment mark area of the carrier substrate. Each marker may include a plurality of alignment marks. The alignment marks may have rectangular shapes and may be provided one-dimensionally. For example, the alignment marks may have a width of around 8 μm and a pitch of around 16 μm. However, the shape and size of the alignment marks are not limited thereto. For example, the alignment marks may have a cross shape. According to another example embodiment, the alignment marks may be provided two-dimensionally.

A first semiconductor device is provided on a first surface of the carrier substrate based on the alignment marks (S140). The first semiconductor device is formed on the first surface of the carrier substrate based on locations of the alignment marks detected by, for example, litho-scanning or by using an overlay tool. The first semiconductor device may be an integrated circuit including components such as, for example, a BPR. The BPR may be provided on the first surface of the carrier substrate.

A wafer-to-wafer bonding process is carried out (S150). For example, a second wafer may be provided on a first surface of the first semiconductor device. The second wafer may be bonded to the first surface of the first semiconductor device by providing an adhesive layer between the second wafer and the first semiconductor device. According to another example embodiment, the second wafer may be directly provided on the first semiconductor device through, for example, Si direct bonding, without including an adhesive layer.

The semiconductor architecture is flipped (S160).

The sacrificial layer is removed to the depth of the stopper layer (S170). The sacrificial layer may be removed by a grinding process including, for example, CMP or dry etching. However, embodiments are not limited thereto.

The stopper layer is removed (S180). The stopper layer may be removed by, for example, wet etching. However, embodiments are not limited thereto. The alignment marks are exposed on the second surface of the carrier substrate. The shape and size of the alignment marks correspond to the shape and size of the alignment marks provided on the first surface of the carrier substrate. The alignment marks may have rectangular shapes and may be provided one-dimensionally. For example, the alignment marks may have a width of around 8 μm and a pitch of around 16 μm. However, the shape and size of the alignment marks are not limited thereto. For example, the alignment marks may have a cross shape. According to another example embodiment, the alignment marks may be provided two-dimensionally A second semiconductor device is provided on the second surface of the carrier substrate based on the alignment marks (S190). The alignment marks may include alignment marks detected based on a litho-scanning method and alignment marks detected by using an overlay tool. As the alignment marks are exposed on the second surface of the carrier substrate, the signals provided by the alignment marks in the litho-scanning and the overlay tool may be stronger, and thus, accuracy of the detection of alignment marks may be improved. The second semiconductor device may be an integrated circuit including components such as, for example, a TSV. The TSV may be provided to penetrate through the carrier substrate. The second semiconductor device may be integrated on the second surface of the carrier substrate such that, for example, the TSV of the second semiconductor device are aligned with the BPR of the first semiconductor device based on the detected locations of the alignment marks.

According to example embodiments, as the detection of the location of alignment marks 10 from the second surface of the wafer becomes more accurate, the alignment between the semiconductor devices provided on the first surface and the second surface of the wafer may become more accurate.

According to the example embodiment, based on the improved alignment between the semiconductor devices on both sides of a wafer in a 3D heterogeneous integrated semiconductor architecture, the integration and the performance of the semiconductor architecture may be improved. In addition, 3D integration of semiconductor devices on both sides of the wafer may reduce the size and power consumption of the semiconductor architecture.

Figure 10:
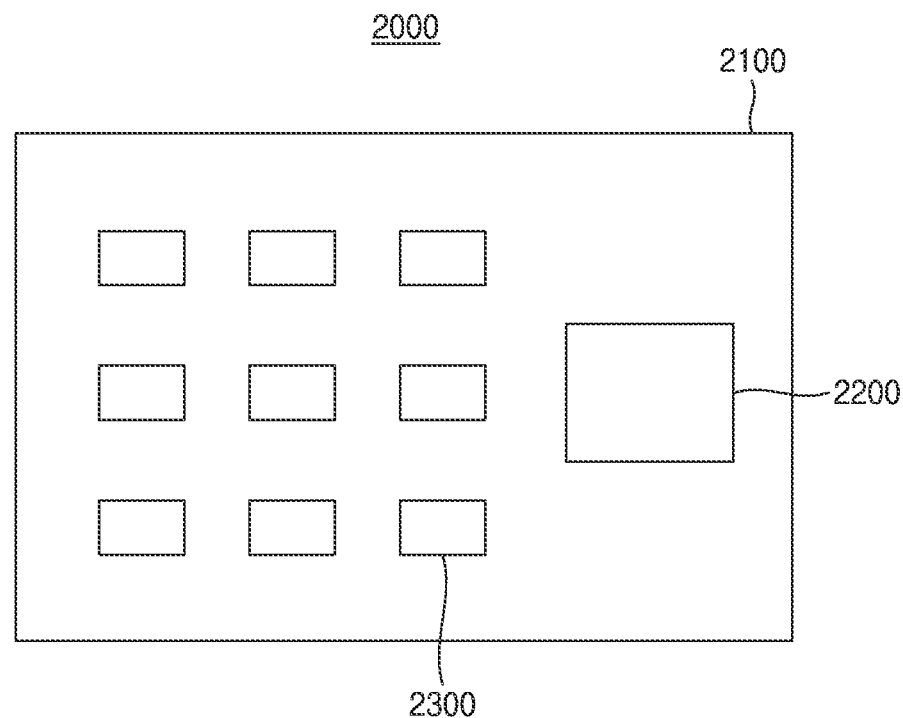
FIG. 10 illustrates a semiconductor package that may incorporate the 3D heterogeneous integrated semiconductor architectures according to example embodiments.

FIG. 10 illustrates a semiconductor architecture that may incorporate the 3D heterogeneous integrated semiconductor architectures according to example embodiments.

Referring to FIG. 10, a semiconductor package 2000 according to an example embodiment may include a processor 2200 and semiconductor devices 2300 that are mounted on a substrate 2100. The processor 2200 and/or the semiconductor devices 2300 may include one or more of 3D heterogeneous integrated semiconductor architecture 1 described in the above example embodiments.

Figure 11:
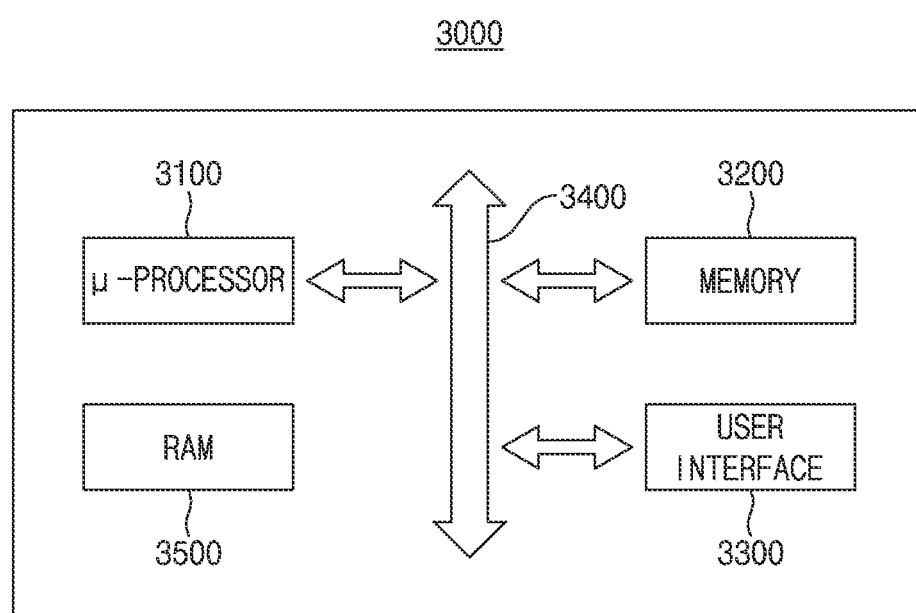
FIG. 11 illustrates a schematic block diagram of an electronic system according to an example embodiment.

FIG. 11 illustrates a schematic block diagram of an electronic system according to an example embodiment.

Referring to FIG. 11, an electronic system 3000 in accordance with an embodiment may include a microprocessor 3100, a memory 3200, and a user interface 3300 that perform data communication using a bus 3400. The microprocessor 3100 may include a central processing unit (CPU) or an application processor (AP). The electronic system 3000 may further include a random access memory (RAM) 3500 in direct communication with the microprocessor 3100. The microprocessor 3100 and/or the RAM 3500 may be implemented in a single module or architecture. The user interface 3300 may be used to input data to the electronic system 3000, or output data from the electronic system 3000. For example, the user interface 3300 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 3200 may store operational codes of the microprocessor 3100, data processed by the microprocessor 3100, or data received from an external device. The memory 3200 may include a memory controller, a hard disk, or a solid state drive (SSD).

At least the microprocessor 3100, the memory 3200 and/or the RAM 3500 in the electronic system 3000 may include a 3D heterogeneous integrated semiconductor architecture 1 as described in the above example embodiments.

It should be understood that example embodiments described herein should be considered in a descriptive sense only and not for purposes of limitation. Descriptions of features or aspects within each example embodiment should typically be considered as available for other similar features or aspects in other embodiments.

While example embodiments have been described with reference to the figures, it will be understood by those of ordinary skill in the art that various changes in form and details may be made therein without departing from the spirit and scope as defined by the following claims.

What is claimed is:

1. A semiconductor architecture comprising:
a carrier substrate;
alignment marks provided in the carrier substrate, the alignment marks being provided from a first surface of the carrier substrate to a second surface of the carrier substrate;
a first semiconductor device provided on the first surface of the carrier substrate based on the alignment marks, the first semiconductor device comprising a buried power rail (BPR) that is extended in a horizontal direction, and formed at an active device level different from metal interconnect structures; and
a second semiconductor device provided on the second surface of the carrier substrate based on the alignment marks and aligned with the first semiconductor device,
wherein a through-silicon via (TSV) penetrates through the carrier substrate in a vertical direction, perpendicular to the horizontal direction, and contacts the BPR and the second semiconductor device.

2. The semiconductor architecture according to claim 1, wherein the BPR is provided on the first surface of the carrier substrate based on locations of the alignment marks provided on the first surface of the carrier substrate.

3. The semiconductor architecture according to claim 2, wherein the TSV is provided on the second surface of the carrier substrate based on locations of the alignment marks provided on the second surface of the carrier substrate.

4. The semiconductor architecture according to claim 3, wherein the BPR is aligned with the TSV.

5. The semiconductor architecture according to claim 1, wherein the alignment marks are provided one-dimensionally or two-dimensionally.

6. The semiconductor architecture according to claim 5, wherein each of the alignment marks has a rectangular shape.

7. The semiconductor architecture according to claim 6, wherein side surfaces of adjacent alignment marks among the alignment marks are parallel to each other.

8. The semiconductor architecture according to claim 1, wherein a second surface of the alignment marks and a first surface of the second semiconductor device are coplanar.

9. The semiconductor architecture according to claim 1, wherein the alignment marks are openings provided in the carrier substrate.

10. A semiconductor architecture comprising:
a wafer;
alignment marks provided in the wafer, the alignment marks being openings provided from a first surface of the wafer to a second surface of the wafer that is opposite to the first surface;
a first semiconductor device provided on the first surface of the wafer based on the alignment marks, the first semiconductor device comprising a buried power rail (BPR) extended in a horizontal direction; and
a second semiconductor device provided on the second surface of the wafer based on the alignment marks and aligned with the first semiconductor device,
wherein a through-silicon via (TSV) penetrates through the wafer in a vertical direction, perpendicular to the horizontal direction, and contacts the BPR and the second semiconductor device.

* * * * *